(12) United States Patent
Rumsey

(10) Patent No.: US 7,115,819 B1
(45) Date of Patent: Oct. 3, 2006

(54) POSITIONING FLOWABLE SOLDER FOR BONDING INTEGRATED CIRCUIT ELEMENTS

(75) Inventor: Brad D. Rumsey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1580 days.

(21) Appl. No.: 09/377,286

(22) Filed: Aug. 18, 1999

(51) Int. Cl.
*H01R 12/04* (2006.01)
*H05K 1/11* (2006.01)
*H05K 7/10* (2006.01)
*H05K 7/12* (2006.01)

(52) U.S. Cl. ..................... 174/261; 361/767
(58) Field of Classification Search ............... 174/260, 174/261; 361/771, 767, 768; 257/779; 228/179.1, 228/180.21, 180.22
See application file for complete search history.

(56) References Cited

U.S. PATENT DOCUMENTS 3,537,176 A * 11/1970 Healy et al.
5,519,580 A * 5/1996 Natarajan et al. ............ 361/760
5,585,162 A * 12/1996 Schueller ..................... 428/131
6,028,366 A * 2/2000 Abe ............................ 257/779

* cited by examiner

*Primary Examiner*—Kamand Cuneo
*Assistant Examiner*—Jeremy C. Norris
(74) *Attorney, Agent, or Firm*—Trop, Pruner & Hu, P.C.

(57) ABSTRACT

A solder mask defined bond pad or a non-solder mask defined bond pad may be configured to center the solder over the bond pad using either surface attractive forces or capillary action. In some embodiments, a stub trace may be provided, for example, in opposition to the real trace to provide a capillary counter-attractive force on the solder. In other embodiments, the surface attractive action of the edge of the solder mask may be utilized to center the solder. In still other embodiments, the natural attractive force of a trace on solder may be utilized to appropriately position solder where desired, for example, to line up with other solder deposits.

12 Claims, 2 Drawing Sheets

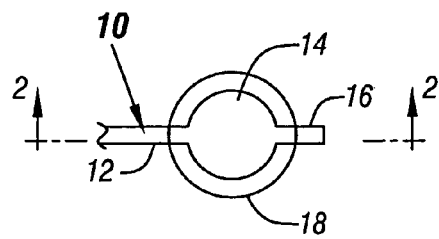
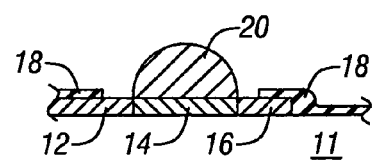
FIG. 1  FIG. 2
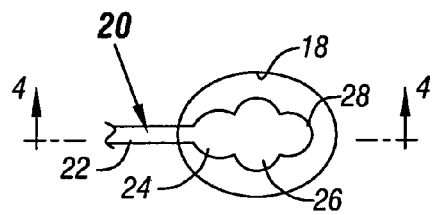
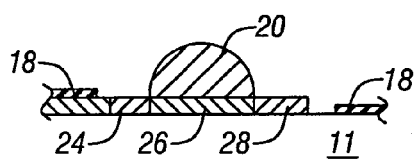
FIG. 3  FIG. 4
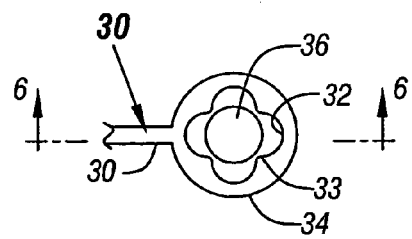
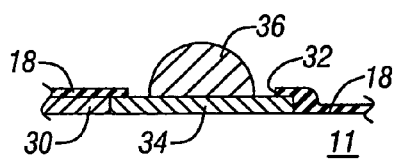
FIG. 5  FIG. 6

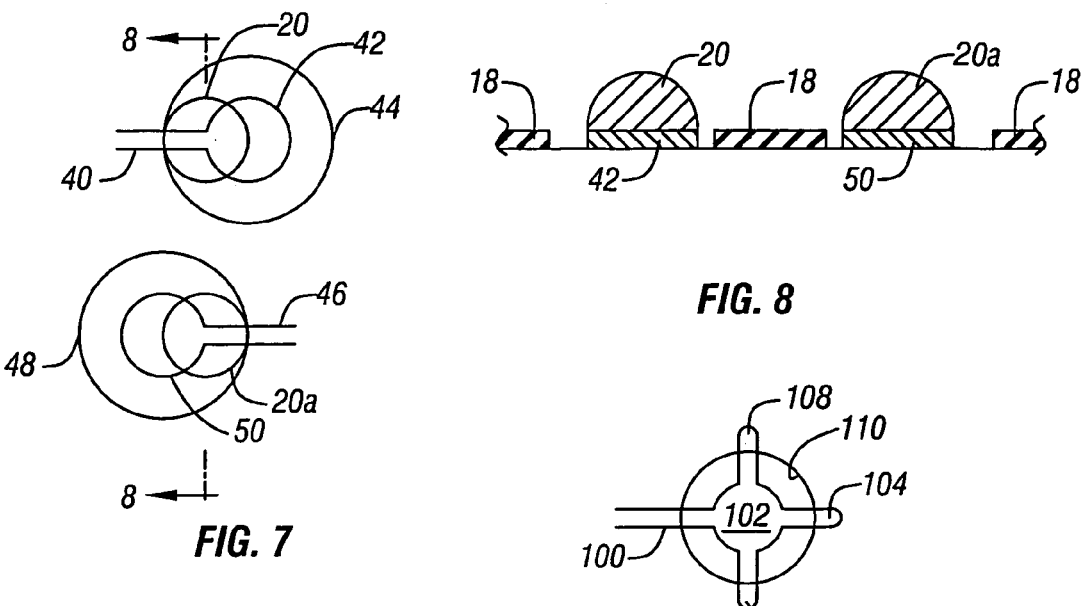
FIG. 7
FIG. 8
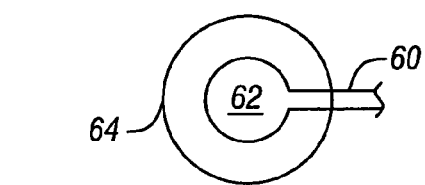
FIG. 9
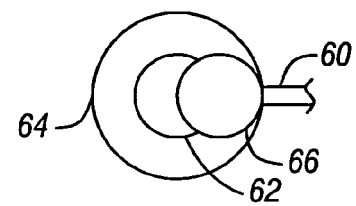
FIG. 10 (PRIOR ART)
FIG. 11 (PRIOR ART)
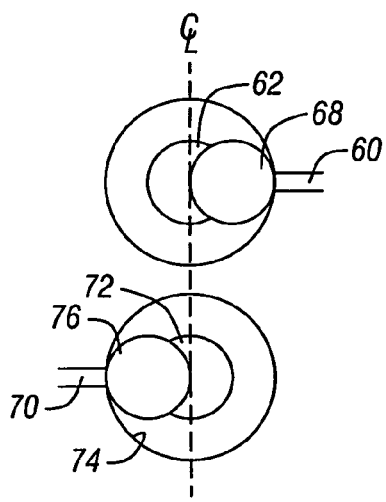
FIG. 12 (PRIOR ART)
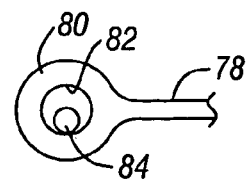
FIG. 13 (PRIOR ART)

POSITIONING FLOWABLE SOLDER FOR BONDING INTEGRATED CIRCUIT ELEMENTS

BACKGROUND

This invention relates generally to solder bonding techniques for integrated circuit devices.

Referring to FIG. 10, commonly solder is deposited on a solder pad 62 which is coupled to other electrical components on an integrated circuit by a trace 60. The solder deposition area is defined by the inwardmost edge 64 of a solder mask. Thus, in the embodiment illustrated in FIG. 10, the solder is deposited inside the circle 64. The solder mask prevents solder outflow over the mask thereby preventing the solder from moving outwardly beyond the edge 64.

The solder may be in the form of conventional solder balls which are deposited in a solid configuration and then reflowed thereafter. Alternating the solder may be a liquid or paste upon deposition.

Referring to FIG. 11, one problem with existing techniques for depositing solder is that when soft the solder 66 tends to wick along the trace 60. Without limitation, it is believed that the wicking is a result of capillary attraction between the solder 66 and the trace 60. As a result, the solder 66 ends up being displaced with respect to the pad 62, as indicated in FIG. 11. In particular, the solder may abut the solder mask edge 64. Generally, the solder does not extend onto the solder mask since the mask functions to control solder flow.

Thus, improper contact may result between the solder and the solder pad 62 as a result of the wicking action of the solder. Of course, this problem may be reduced by decreasing the diameter of the opening 64 in the solder mask. However, this creates tighter tolerances in the process flow. One adverse result may be that the solder mask opening is misaligned to the pad 62 to such an extent that the solder mask opening does not permit the solder to be placed on the pad.

In ball grid array (BGA) packaging techniques an array of solder pads may be aligned with an array of solder balls. If the balls tend to wick away from their solder pads, the balls may become misaligned with other balls in the array. Thus, there may be no way to cause an integrated circuit connector to appropriately connect to all the balls because all the balls have been randomly misaligned. Referring to FIG. 12, the ball 68 on the top has wicked to the right because its trace 60 extends to the right whereas the ball 76 on the bottom has wicked to the left because of the leftward extension of its trace 70. The center line "CL" of the pads 62 and 72 may have been the projected alignment between the balls. In fact the balls are substantially misaligned.

Still another problem that may arise in the prior art is the surface action effects of the edge of the solder resist mask. FIG. 13 illustrates a conventional solder mask defined pad (SDP). In this case, the useful portion of the pad 80 is effectively defined by the opening 82 in the solder mask. This is because the size of the opening 82 is less than the size of the pad 80. Thus, wicking along the trace 78 may be prevented. However, the mask may tend to attract the solder 84 to its edge, for example as a result of surface attraction effects. Again, the problem is similar to the problem described previously in that the solder tends to be attracted away from its desired location.

Thus, there is a need for better ways to appropriately position solder on bond pads coupled to conductive traces.

SUMMARY

In accordance with one embodiment, a bond pad assembly may include a bond pad and a trace coupled to the pad. The trace extends away from the pad in a first direction. A trace stub is coupled to the pad and extends away from the pad in a direction other than the first direction.

Other aspects are set forth in the ensuing detailed description and claims.

BRIEF DESCRIPTION OF THE DRAWINGS

FIG. 1 is an enlarged top plan view of one embodiment to the present invention;

FIG. 2 is a cross-sectional view taken generally along the line 2—2 shown in FIG. 1 after solder has been placed on the pad;

FIG. 3 is an enlarged top plan view of another embodiment of the present invention;

FIG. 4 is a cross-sectional view taken generally along the line 4—4 shown in FIG. 3 after solder has been placed on the pad;

FIG. 5 is an enlarged top plan view of still another embodiment to the present invention;

FIG. 6 is a cross-sectional view taken generally along the line 6—6 in FIG. 5;

FIG. 7 is an enlarged top plan view of still another embodiment of the present invention;

FIG. 8 is a cross-sectional view taken generally along the line 8—8 in FIG. 7 after the solder has been placed on the pads;

FIG. 9 is an enlarged top plan view of another embodiment of the present invention;

FIG. 10 is an enlarged top plan view of an embodiment in accordance with the prior art;

FIG. 11 is an enlarged top plan view of another embodiment in accordance with the prior art;

FIG. 12 is an enlarged top plan view of still another embodiment in accordance with the prior art; and FIG. 13 is an enlarged top plan view of still another embodiment in accordance with the prior art.

DETAILED DESCRIPTION

Referring to FIG. 1, a bond assembly 10 includes a bond pad 14 coupled to a trace 12 extending away from the bond pad 14 in a first direction. The bond assembly may be formed on a support which may be, for example, an integrated circuit die, an interposer, or a printed circuit board. While the bond pad 14 is illustrated as being circular other shapes can be used as well. The bond pad 14 may be utilized in connection with packaging a variety of different integrated circuit devices.

In one application, the bond pad 14 may be arranged to interact with solder balls to implement a flip chip bonding technique, a ball grid array bonding technique or any of the variations of bump-type interconnections which may be known to those skilled in the art. In ball grid array packaging techniques, a relatively solid ball is positioned on the bond pad and subsequently reflowed. In other techniques, liquid or semi-liquid solder may be utilized which may flow upon deposition without the application of heat.

A trace stub 16 extends away from the bond pad 12 in a second direction. Advantageously, the stub 16 may be made of the same material and may be of the same width and thickness as the trace 12. The first and second directions may be diametrically opposed.

The region which may receive the solder may be greater than the size of the bond pad 14. Conveniently, the potential solder receiving area may be defined by a solder mask whose inward extent is marked by the solder mask edge 18. Thus, solder is masked away from the remainder of the device with the exception of the area inside the edge 18.

Referring to FIG. 2, a solder ball 20 has been reflowed over the pad 14. As shown in FIG. 2, the solder mask edge 18 actually overlaps the trace stub 16. This provides greater tolerances and ensures that the stub 16 will extend beyond the solder mask edge 18. With this configuration, if the solder attempts to wick to the left to follow the trace 12 due to capillary action or any other reason, it will be pulled back to the right by the action of the stub 16. Thus, the forces applied by the stub 16 counteract the wicking action of the trace 12. In some embodiments, it may be desirable to make the solder pad 14 relatively small so that the solder ball 20 is acted upon simultaneously by both the trace 12 and stub 16.

In another embodiment of the present invention, shown in FIG. 3, a bond assembly 20 includes an enlarged elliptical or teardrop-shaped bond pad portion 24 which is designed to reduce the capacitance caused by the bond pad main circular section 26. Thus, the bond pad portion 24 has a elliptical configuration of smaller size than that the main circular section 26. The portion 24 is coupled to the trace 22 on one end. In the embodiment illustrated in FIG. 3, a matching or mirror image portion or stub 28 is formed on the other side of the section 26. The function of the stub 28 is to counteract any wicking action resulting from the portion 24. In some embodiments an additional stub, like the stub 16, may be caused to extend outwardly from the stub 28 in opposition to the trace 22.

In the embodiment illustrated in FIG. 3, the matching stub 28 does not extend outside of the boundary defined by the solder mask edge 18. Thus, in some embodiments it may be preferable to cause the matching portion to extend beyond the solder mask edge and in other cases this may not be desirable.

Referring to FIG. 4, when a solder ball 20 is positioned on the section 26, it is equally attracted to the left and to the right by the opposed portions 24 and 28. Thus, the solder ball 20 may center on the section 26.

The embodiment in FIG. 1 illustrates a non-solder mask defined pad (NSDP). However, as explained in more detail hereinafter, the present invention is also applicable to solder mask defined pads (SDP). Referring now to FIG. 5, showing an SDP embodiment of the present invention, a solder mask has a cloverleaf-shaped edge 32 which extends inwardly of the bond pad 34 and its trace 30. Each of the lobes 33 of the cloverleaf-shaped edge 32 may have a surface action attraction on the solder ball 36.

By providing four sets of identically shaped clover leaf shaped lobes, the action of the edges 32 on the solder may be neutralized. One force on the solder is believed to be due to surface tension effects. Moreover, by having the convex edges 35 of the solder mask 32 substantially spaced apart by a diameter approximately equally the diameter of the solder 36, the solder tends to be maintained substantially centrally, as illustrated in FIG. 6.

Referring now to FIGS. 7 and 8, an embodiment in which the wicking action of a traces 40 and 46 may be used to achieve a desired orientation for solder balls 20 and 20A is illustrated in an NSDP arrangement. In this case, the bond pads 42 and 50 may be placed relatively closer together than is normally the case. This may be done by causing the bond pad 50 to overlap with the trace 40 coupled to the bond pad 42 so that a nested configuration may be achieved. In each case, a solder mask edge 44 or 48 is defined which delimits the extent to which the solder ball 20 or 20a may move.

After being deposited on the pad 42 and reflowed, the solder ball 20 may tend to move to the left due to the wicking action of the trace 40. Similarly, when the solder ball 20a is placed on the pad 50, it tends to wick to the right. As a result of the wicking action, the solder balls 20 and 20a line up one above the other exactly as desired. Thus, in this case, the adverse effect of trace wicking is used to obtain the desired alignment between the balls. The desired ball alignment may be useful in causing the balls to interact with other contacts on another device. In some cases, this technique may enable the bond pads to be nested and thereby packed together more closely.

Turning now to FIG. 9, still another embodiment of a non-solder mask defined pad is illustrated. In this case, the pad 102 is coupled to a trace 100. A solder receiving area is defined by the edge 110 of the solder mask. A trace stub 104 is provided as illustrated previously in connection with FIG. 1. In addition, a pair of trace stubs 108 and 106 extend transversely to the lengths of the trace 100 and the stub 104. The stubs 106 and 108 center the solder (not shown) along the axis transverse to the axis of the trace 100 and the stub 104. The stubs 106 and 108 provide effectively vertical centering in the orientation shown in FIG. 9, while the stub 104 together with the trace 100 provide horizontal centering. Thus, the embodiment shown in FIG. 9 prevents the solder from moving up or down. The solder may move up and down, not because of the wicking action of the trace, but for some other reason such as other attractive forces, or tilting of the pad supporting surface.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A bond pad assembly comprising:
   a bond pad;
   a trace that applies an attractive force to solder placed on the pad, said trace coupled to said pad and extending away from said pad in a first direction; and
   a trace stub to counteract the attractive force applied by the trace, said trace stub coupled to said pad and extending away from said pad in a direction other than said first direction.

2. The assembly of claim 1 wherein said stub extends diametrically away from said trace.

3. The assembly of claim 1 wherein said bond pad is a non-solder mask defined pad.

4. The assembly of claim 1 wherein said stub has a thickness and width substantially equal to the thickness and width of said trace.

5. The assembly of claim 1 including a solder mask which defines a solder receiving area proximate to said bond pad.

6. The assembly of claim 5 wherein said stub extends outwardly into said solder mask.

7. A bonding system comprising:
   a bond pad;
   a trace coupled to said bond pad and extending away from said pad; and
   an element adapted to counteract an attractive force applied by the trace to solder placed on the bond pad.

8. The system of claim 7 wherein said element includes a trace-like portion extending away from said bond pad in a direction opposite to the direction that said trace extends away from said bond pad.

9. The system of claim 8 wherein said trace-like element has the width and thickness of said trace.

10. The system of claim 7 including a solder mask defining a solder mask opening around said bond pad, said element extending from said bond pad and through said opening.

11. The system of claim 7 wherein the attractive force applied by the trace to said solder arises from said trace being coupled to and extending away from said bond pad, said element adapted to emulate said trace.

12. The system of claim 7 wherein said element is configured symmetrically to said trace.

\* \* \* \* \*